United States Patent [19]

Maroney et al.

[11] Patent Number: 4,563,722

[45] Date of Patent: Jan. 7, 1986

[54] ANTISTATIC SHELF FOR ELECTRONIC CIRCUIT BOARDS

[75] Inventors: Ralf P. Maroney; Gregory A. Fishkind, both of Milford, Conn.

[73] Assignee: Plug-In Storage Systems, Inc., Milford, Conn.

[21] Appl. No.: 645,053

[22] Filed: Aug. 28, 1984

[51] Int. Cl.⁴ .................... H05K 7/18; H05K 9/00
[52] U.S. Cl. .................... 361/212; 361/415; 361/424; 211/41; 206/334
[58] Field of Search ............ 361/390, 391, 415, 424, 361/427, 212, 386–388; 206/328, 334; 211/26, 41; 248/245, 297.2; 174/35 R

[56] References Cited

U.S. PATENT DOCUMENTS

| | | | |
|---|---|---|---|
| 3,132,609 | 5/1964 | Chesley | 248/245 |
| 3,258,650 | 6/1966 | Fiege | 361/424 |
| 3,293,353 | 12/1966 | Hendricks | 361/424 |
| 3,405,001 | 10/1968 | Iler | 117/121 |
| 3,541,395 | 11/1970 | Lucchino | 361/391 |
| 4,223,368 | 9/1980 | Dattilo | 361/220 |
| 4,231,901 | 11/1980 | Berbeco | 252/511 |
| 4,293,070 | 10/1981 | Ohlbach | 206/328 |
| 4,353,469 | 10/1982 | Etchison, Jr. | 361/415 |
| 4,415,946 | 11/1983 | Pitts | 361/212 |
| 4,427,114 | 1/1984 | Howell | 206/334 |
| 4,454,566 | 6/1984 | Coyne | 361/386 |

Primary Examiner—G. P. Tolin
Attorney, Agent, or Firm—Kramer and Brufsky

[57] ABSTRACT

An adjustable antistatic shelf is provided for supporting electronic circuit boards in a storage cabinet. The shelf includes a base having parallel planar top and bottom surfaces. A plurality of parallel rail pairs extends outwardly from the top surface of the base, the rails in each pair spaced apart to form a groove of a first width, with adjacent rail pairs spaced from each other to form grooves of a second width. A complementary plurality of rail pairs extends outwardly from the bottom surface of the base in alignment with the rail pairs extending from the top surface. Tabs extend from the shelf for adjustably mounting the shelf to tracks in a storage cabinet. The shelf is molded as a unit from a conductive plastic.

10 Claims, 6 Drawing Figures

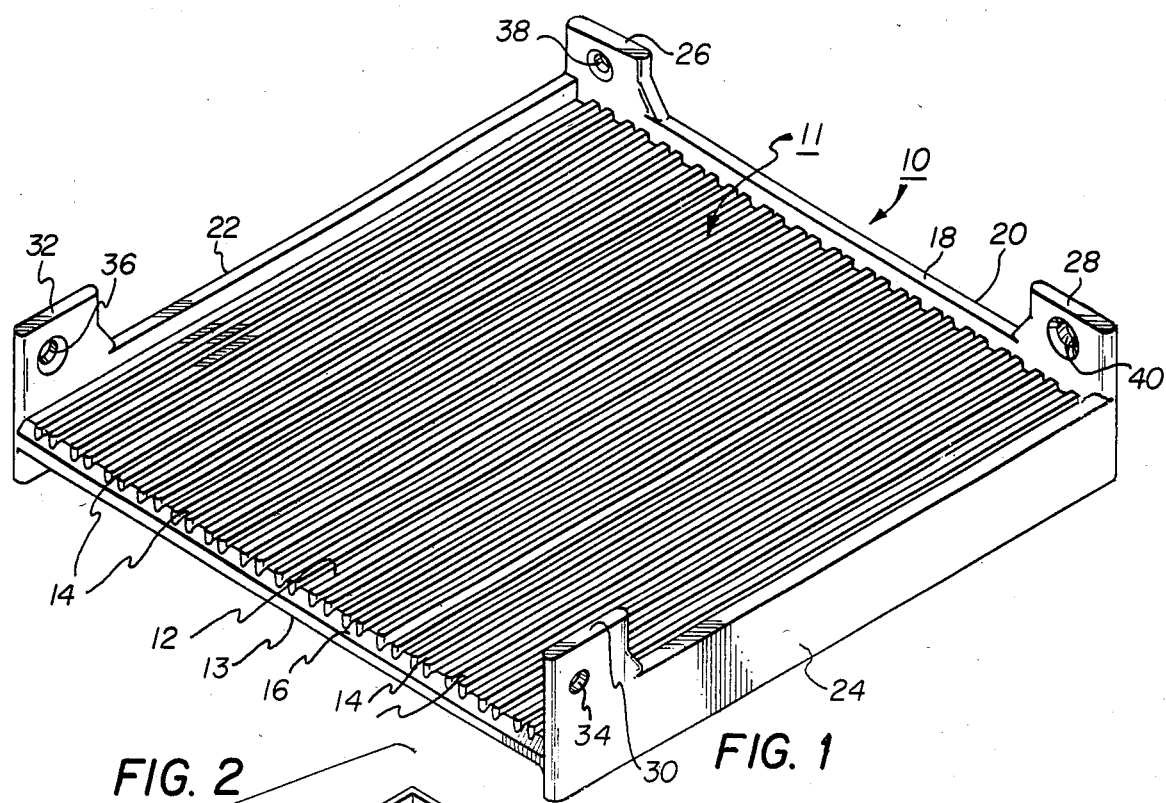
FIG. 1
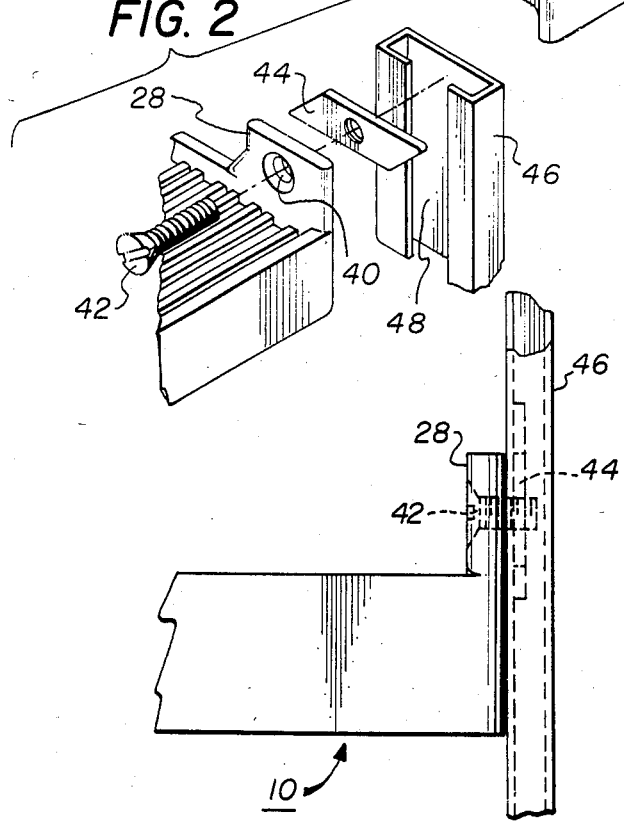
FIG. 2
FIG. 3
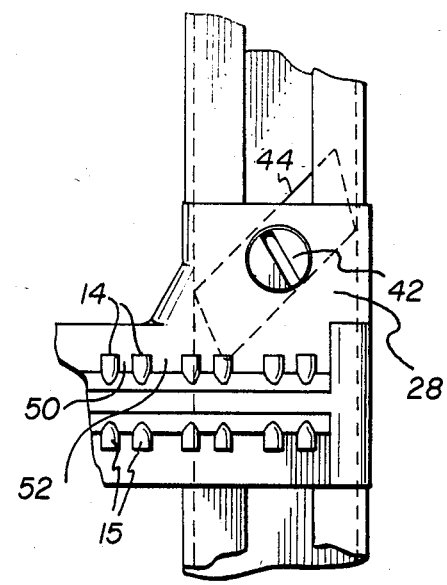
FIG. 4

ANTISTATIC SHELF FOR ELECTRONIC CIRCUIT BOARDS

BACKGROUND OF THE INVENTION

The present invention relates to an antistatic shelf for supporting electronic circuit boards, and more particularly to such a shelf which can be adjustably mounted in a storage cabinet or container.

Circuit boards, such as those used by the telecommunication and electronic industries, contain expensive solid state and microelectronic components which are extremely sensitive to static electricity. Often, such boards can run in the thousands or tens of thousands of dollars each, yet can be destroyed by transient static charges such as those which sometimes jump from a person's hand to a metal handrail or the like under conditions of low humidity. Such circuit boards can also be destroyed by the uncontrolled, rapid discharge of components thereon after removal of the boards from active service in a computer, switching system, or the like. It is therefore necessary to protect such circuit boards against ambient static charges and against rapid discharge of the components on the circuit board.

Prior solutions to the static and discharge problems have centered around containers for the circuit boards, such as plastic bags or cartons, which are rendered conductive with an appropriate antistatic agent. Chemical agents for providing antistatic properties are disclosed, for example, in U.S. Pat. No. 3,405,001. Examples of known antistatic containers for electronic parts are provided in U.S. Pat. Nos. 4,293,070 and 4,231,901. The '070 patent discloses a container composed entirely of paperboard coated on the inside surfaces with conductive carbon black particles to prevent an outside static electricity charge from passing through the container. In the '901 patent, a urethane foam having electrically conductive properties is used to wrap electronic components to protect them from static charge. The foam contains a binding agent and is impregnated generally uniformly therethrough with an electrically conductive amount of an electrically conductive particulate material, e.g. carbon-black, silver, aluminum, or a metal salt. U.S. Pat. No. 4,223,368 discloses an electrostatic discharge protection device adapted to be clipped onto edge connectors of a circuit card assembly. The device includes a shunt for electrically short circuiting the edge connectors of the card.

When removing circuit cards from electronic mainframes, it is inconvenient to re-package the boards in individual storage containers such as the cartons or bags described above. However, it is imperative that such boards be stored, for future use, in a manner which will protect them against damage from electrostatic discharge. It would therefore be advantageous to provide a storage facility, such as a cabinet or other container, into which the circuit boards can be placed for convenient retrieval when needed, and which protects the circuit boards and the components thereon from damage due to electrostatic discharge. Such a cabinet should provide flexibility in terms of the types and sizes of circuit boards which it can accomodate.

The present invention relates to an adjustable antistatic shelf for such a storage cabinet or like container.

SUMMARY OF THE INVENTION

In accordance with the present invention, an antistatic shelf for adjustably supporting electronic circuit boards in a storage cabinet is provided. The shelf comprises a base having parallel planar top and bottom surfaces. A plurality of parallel rail pairs extends outwardly from the top surface of the base. The rails in each pair are spaced apart a first distance, and adjacent rail pairs are spaced from each other by a second distance. A complimentary plurality of rail pairs extends outwardly from the bottom surface of the base and in alignment with the rail pairs extending from the top surface. Means are provided for adjustably mounting the base in a storage cabinet. The shelf is molded as a unit from a conductive plastic.

In use, several shelves are arranged in a storage cabinet in a stacked arrangement. The spacing between successive shelves is determined by the height of circuit boards to be stored between those shelves. A circuit board to be stored is slid into grooves formed in the top surface of a lower shelf and corresponding grooves in the bottom surface of an upper shelf mounted directly above the lower shelf. Different height circuit boards are easily accomodated by adjusting the separation between the lower and upper shelves. Different width circuit boards are accomodated by variable width grooves provided on the shelves. Thus, for example, if the rails in each rail pair forming the grooves are closer together than the rails of adjacent rail pairs, a thin circuit board would be supported between the rails of a rail pair, and a relatively thicker circuit board would be supported between the rails of adjacent rail pairs.

BRIEF DESCRIPTION OF THE DRAWINGS

Further objects and advantages of the invention will become apparent from the following description and claims, and from the accompanying drawings, wherein:

FIG. 1 is a perspective view of a shelf in accordance with the present invention;

FIG. 2 is a detail view of a corner of the shelf illustrating its mounting to a track within a storage cabinet;

FIG. 3 is a partial side view illustrating one corner of the shelf after it has been mounted to the storage cabinet track;

FIG. 4 is a partial front view illustrating a corner of the shelf mounted in a storage cabinet;

DETAILED DESCRIPTION OF THE PREFERRED EMBODIMENT

Figure 5:
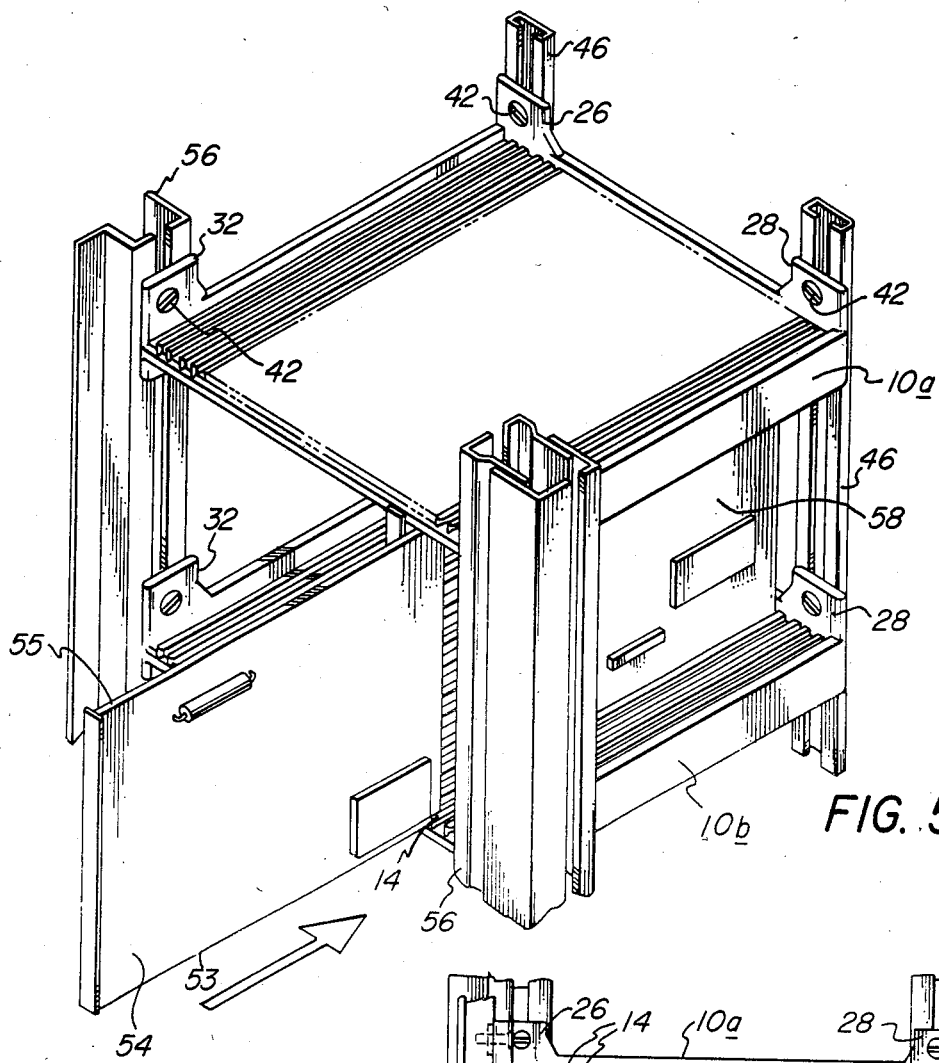
FIG. 5 is a perspective view of two shelves mounted on tracks of a storage cabinet illustrating the storage and placement of circuit boards.

The shelf of the present invention is adapted to be mounted in a storage cabinet of the type disclosed in copending U.S. patent application Ser. No. 645,054, entitled "Plug-In Circuit Board Storage Cabinet" and assigned to the assignee of the present application. The disclosure of said copending application is incorporated herein by reference.

Turning now to FIG. 1, a shelf 10 includes a base 11 having parallel planar top and bottom surfaces 12 and 13, respectively. A plurality of parallel rail pairs 14 extend outwardly from top surface 12 of base 11. The rails in each pair are spaced apart a first distance 50 (see FIG. 4), with adjacent rail pairs spaced from each other by a second distance 52. The grooves thus formed will accomodate circuit boards of different thicknesses. Most circuit boards will fit in the groove having width 50. However, in certain instances connectors or other components located at the very edges of a conventional circuit board will require a groove with a larger width 52 in order to provide enough room for insertion of the circuit board on shelf 10.

A complimentary plurality of rail pairs 15 extends outwardly from the bottom surface 13 of base 11. Each of rail pairs 15 is in alignment with a complimentary rail pair 14 extending from top surface 12 of base 11. In this manner, grooves having a relatively narrow width 50 and grooves having a relatively wide width 52 will be present and in alignment on both the top surface 12 and bottom surface 13 of base 11.

Shelf 10 can be adjustably mounted in a storage cabinet using tabs 26, 28, 30 and 32 which are integrally molded with the base at each corner thereof. Tabs 30 and 32 are adjacent front edge 16 of base 11, and are referred to herein as the "front tabs". Front tabs 30, 32 extend from side edges 24, 22 respectively of base 11 so as to maximize access to the shelf along the front edge 16 thereof. "Rear tabs" 26, 28 extend from rear edge 20 of base 11. An upwardly extending lip 18 also extends from rear edge 20 beyond top surface 12 of base 11. Lip 18 prevents a circuit board supported on shelf 10 from being pushed beyond rear edge 20 of base 11. Since access for sliding a circuit board onto shelf 10 is provided from the front of the shelf, there is no problem in extending rear tabs 26, 28 from rear edge 20. Conversely, if one were to extend front tabs 30, 32 from front edge 16 of base 11, access to shelf 10 would be restricted. Thus, it is preferable to extend front tabs 30, 32 from side edges 24, 22 as shown.

Shelf 10 is preferably injection-molded from a structural polyethylene which has been treated to render it conducting. One material which can be used for this purpose is the "low ohmic" conductive plastic sold by ACO, Inc. of Oklahoma City, Okla. Two electrical characteristics are of concern in choosing a suitable conductive plastic for use in shelf 10. The first is the ability of the material to safely dissipate the charge on a printed circuit board. If the shelf material is too conductive, electrostatic discharge can occur due to the rapid discharge of the printed circuit board through the shelf. It has been found that an ohmic material with a sheet resistance of $10^5$ to $10^{13}$ ohms per square is sufficient to safely discharge charged devices. The conductive plastic manufactured by ACO, Inc. and referred to above has a sheet resistance in the $10^{10}$ to $10^{13}$ ohms per square range.

The second electrical factor of importance in such a material is the ability to dissipate charge that may be generated due to triboelectric factors. For instance, when dragging the material across a benchtop or across a floor, the rubbing of the material against the dissimilar material of the benchtop or floor can create static charge. The ability of the material to dissipate this charge is measured by its decay rate. A suitable material, such as that manufactured by ACO, Inc. referred to above, should have a decay rate of about 2 seconds or less when charged to 3,000 volts.

FIGS. 2 to 4 illustrate the mounting of shelf 10 within a storage cabinet. The storage cabinet includes a track 46 having an opening 48. A threaded fastener 42 is inserted through opening 40 in tab 28 and threaded into a backing plate 44. Backing plate 44 is then inserted into groove 48 and fastener 42 is tightened, thereby clamping the edges of track 46 between tab 28 and backing plate 44. The remaining tabs 26, 30, and 32 of shelf 10 are fastened to tracks in the storage cabinet in a similar manner. Openings 38, 34, and 36 are provided in tabs 26, 30, and 32, respectively, to accomodate threaded fasteners 42.

As shown in FIG. 5, a circuit board 58 is stored between shelves 10a and 10b which, in turn, are mounted in a storage cabinet. Circuit board 58 can be removed from the storage cabinet by merely pulling it forward out of the grooves provided by rail pairs 14 and 15 on boards 10b and 10a, respectively. Insertion of circuit board 54 is also illustrated. The upper edge 55 of circuit board 54 is placed in a groove formed by rail pairs 15 of shelf 10a. At the same time, the lower edge 53 of circuit board 54 is inserted into a groove formed by rail pairs 14 of shelf 10b.

Figure 6:
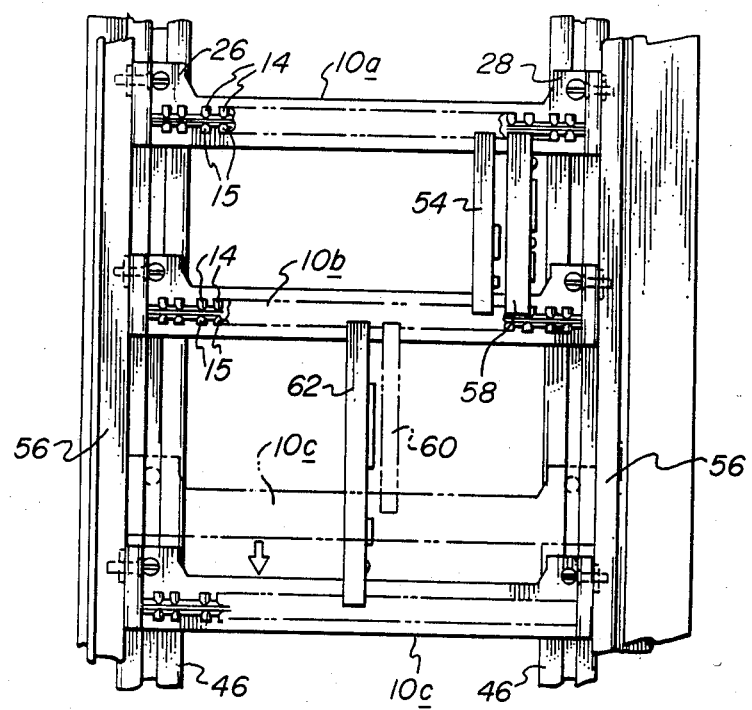
FIG. 6 is a front view of a plurality of shelves mounted on tracks of a storage cabinet illustrating how the shelves may be vertically adjusted to store circuit boards of different heights.

Shelves 10 can be adjusted vertically within a storage cabinet as illustrated in FIG. 6, which is a front view of three shelves mounted in tracks of a storage cabinet. Rear tabs 26, 28 of each of shelves 10 are mounted to rear tracks 46. Front tabs 30, 32 of each of shelves 10 are mounted to front tracks 56. Circuit cards 54 and 58 are shown mounted between shelves 10a and 10b. Shelf 10c is shown in one position to accomodate a circuit board 62 and in a phantom position to accomodate a shorter circuit board 60. Shelf 10c can be moved from the phantom position shown to the lower position by loosening each of threaded fasteners 42 in tabs 26, 28, 30, and 32, then sliding the shelf downwardly as indicated, and retightening fasteners 42 to clamp the shelf in the lower position.

By fabricating tracks 46 and 56 as well as the storage cabinet (not shown) from a conductive material, charge dissipated by shelves 10 will be conducted away therefrom through the tracks and the storage cabinet. In use, the storage cabinet is generally grounded to an earth ground to provide maximum safety to the circuit boards stored therein.

What is claimed is:

1. An antistatic shelf for adjustably supporting electronic circuit boards in a storage cabinet or the like comprising:
    a base having parallel planar top and bottom surfaces;
    a plurality of parallel grooves disposed in said top surface, a first set of said grooves having a relatively narrow width and a second set of said grooves having a relatively wide width;
    a complementary plurality of parallel grooves disposed in said bottom surface extending in the same direction and in alignment with the grooves in said top surface, individual grooves in the bottom surface having a width correspnding to that of the groove aligned therewith on the top surface; and
    means for adjustably mounting said base in a storage cabinet;
    said base and grooves molded as a unit from a conductive plastic.

2. The shelf of claim 1 wherein said base is square or rectangular and said mounting means comprises:
    a tab integrally molded at each corner of said base and;
    mechanical fastener means for attaching said tabs to corresponding tracks in a storage cabinet.

3. The shelf of claim 2 wherein said tabs each include an opening and said fastener means comprises a threaded fastener inserted through the opening of each tab and threaded into a rotatable backing plate adapted to be inserted and rotated in an opening in a corresponding track for engagement with opposed walls of said track, whereby said tabs and backing plates can form clamps upon rotation of said backing plate in said track for mounting the shelf to storage cabinet tracks by clamping corresponding tracks between tabs and backing plates upon tightening of said threaded fasteners.

4. The shelf of claim 2 wherein said base has a front edge, a rear edge, and opposed side edges perpendicular to said front and rear edges; and a lip extending upwardly from said rear edge beyond said top surface to prevent a circuit board supported on the base from being pushed beyond said rear edge.

5. The shelf of claim 4 wherein the tabs integrally molded at the front corners of said base extend from said side edges to maximize access to said base along the front edge thereof.

6. The shelf of claim 5 wherein the tabs integrally molded at the rear corners of said base extend from the rear edge thereof, and are perpendicular to the front tabs.

7. The shelf of claim 1 wherein said conductive plastic comprises injection-molded structural polyethylene.

8. The shelf of claim 1 wherein said relatively narrow and relatively wide grooves are disposed on said top surface in an alternating pattern with corresponding alternating relatively narrow and wide grooves on said bottom surface.

9. The shelf of claim 1 wherein said grooves are formed from a plurality of parallel rails extending outwardly from said top and bottom surfaces.

10. The shelf of claim 9 wherein said rails are arranged in pairs defining said relatively narrow width, with the spacing between adjacent pairs defining said relatively wide width, whereby said grooves are formed in an alternating relatively narrow and relatively wide pattern.

* * * * *